(12) United States Patent
Xi et al.

(10) Patent No.: US 9,123,681 B2
(45) Date of Patent: Sep. 1, 2015

(54) DISPLAY PANEL

(71) Applicant: Au Optronics Corporation, Hsinchu (TW)

(72) Inventors: Peng-Bo Xi, Taipei (TW); Lee-Hsun Chang, Hsinchu County (TW); Li-Fong Lin, Taichung (TW)

(73) Assignee: Au Optronics Corporation, Hsinchu (TW)

( * ) Notice: Subject to any disclaimer, the term of this patent is extended or adjusted under 35 U.S.C. 154(b) by 120 days.

(21) Appl. No.: 13/654,435

(22) Filed: Oct. 18, 2012

(65) Prior Publication Data

US 2014/0043372 A1 Feb. 13, 2014

(30) Foreign Application Priority Data

Aug. 9, 2012 (TW) .............................. 101128840 A

(51) Int. Cl.
*H01L 27/32* (2006.01)
*G09G 3/32* (2006.01)
*H01L 29/417* (2006.01)

(52) U.S. Cl.
CPC .......... *H01L 27/3276* (2013.01); *H01L 27/326* (2013.01); *G09G 3/3233* (2013.01); *H01L 29/41733* (2013.01)

(58) Field of Classification Search
CPC ........... G09G 3/20; G09G 3/34; H01L 27/326
See application file for complete search history.

(56) References Cited

U.S. PATENT DOCUMENTS

| 8,508,445 | B2 | 8/2013 | Yamashita et al. | |
|---|---|---|---|---|
| 8,610,122 | B2 | 12/2013 | Taneda et al. | |
| 8,742,419 | B2 | 6/2014 | Taneda et al. | |
| 8,841,672 | B2 | 9/2014 | Taneda et al. | |
| 2004/0051724 | A1 | 3/2004 | Elliott et al. | |
| 2006/0139290 | A1* | 6/2006 | Chiang et al. | ................. 345/100 |
| 2007/0159492 | A1 | 7/2007 | Lo et al. | |
| 2008/0316413 | A1 | 12/2008 | Cho | |
| 2010/0045654 | A1 | 2/2010 | Yamashita et al. | |
| 2010/0230681 | A1 | 9/2010 | Taneda et al. | |
| 2011/0128268 | A1* | 6/2011 | Kim et al. | ..................... 345/211 |
| 2012/0146981 | A1 | 6/2012 | Lau et al. | |
| 2014/0054575 | A1 | 2/2014 | Taneda et al. | |
| 2014/0183510 | A1 | 7/2014 | Taneda et al. | |

FOREIGN PATENT DOCUMENTS

| CN | 101656045 | 2/2010 |
|---|---|---|
| CN | 101819366 | 9/2010 |

(Continued)

*Primary Examiner* — Claire X Pappas
*Assistant Examiner* — Richard Hong
(74) *Attorney, Agent, or Firm* — Jianq Chyun IP Office

(57) ABSTRACT

A display panel includes a plurality of scan lines, a plurality of data lines, a plurality of power lines, a plurality of light emitting units, a plurality of first pixel circuits and a plurality of second pixel circuits. The plurality of light emitting units are arranged in an array and adapted to display different colors. In the organic light emitting units with the same color, some parts are connected to the first pixel circuits, and other parts are connected to the second pixel circuits. A first terminal and a second terminal of a first control transistor in the first pixel circuit are sequentially arranged on a forward direction of a first direction, and a first terminal and a second terminal of a second control transistor in the second pixel circuit are sequentially arranged on a reverse direction of the first direction.

15 Claims, 10 Drawing Sheets

(56) References Cited

FOREIGN PATENT DOCUMENTS

| CN | 202189508 | 4/2012 |
|---|---|---|
| TW | 200707380 | 2/2007 |
| TW | I297581 | 6/2008 |
| TW | 200849169 | 12/2008 |
| TW | 201033682 | 9/2010 |
| TW | 201044351 | 12/2010 |
| TW | 201225043 | 6/2012 |

* cited by examiner

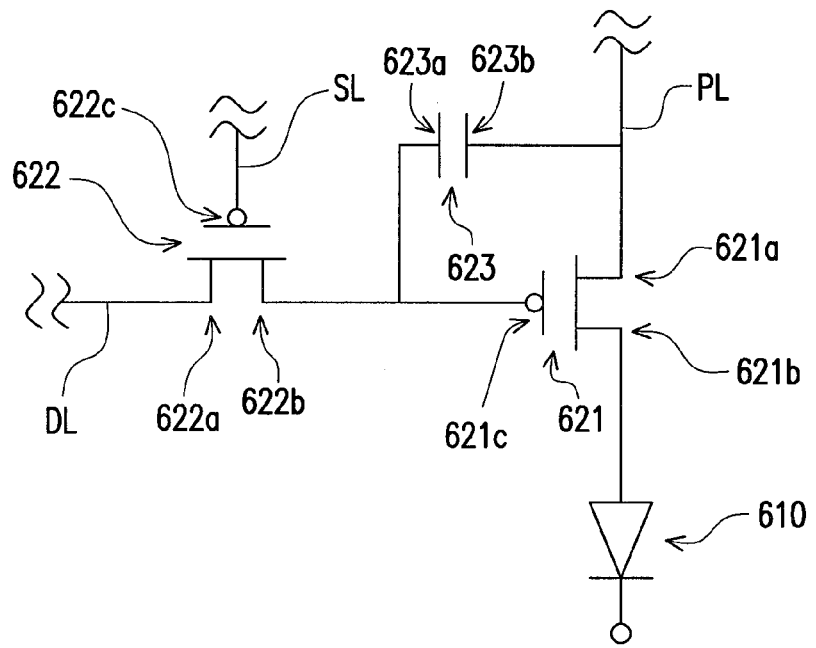
FIG. 11
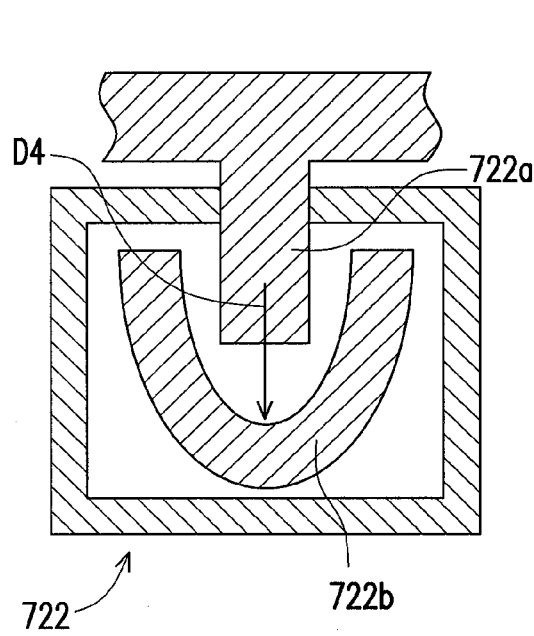 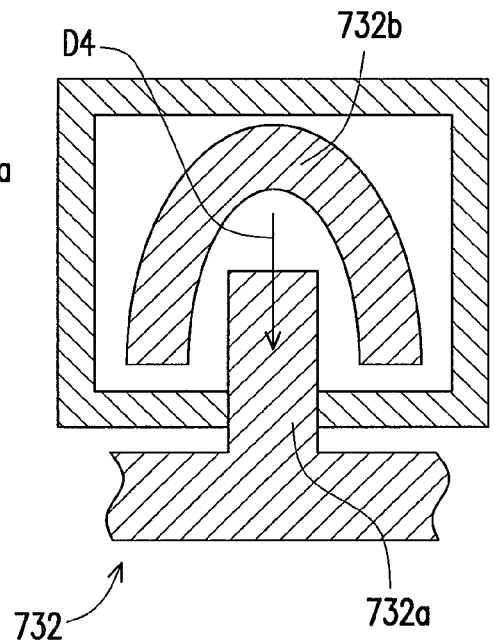
FIG. 12A          FIG. 12B

DISPLAY PANEL

CROSS-REFERENCE TO RELATED APPLICATION

This application claims the priority benefit of Taiwan application serial no. 101128840, filed on Aug. 9, 2012, the entirety of the above-mentioned patent application is hereby incorporated by reference herein and made a part of this specification.

BACKGROUND

1. Technical Field

The invention relates to a panel, and more particularly, to a display panel.

2. Related Art

Thin film transistors are often utilized as a switching element of a pixel structure in a display panel. In the known thin film transistor structure, a gate and a source of the thin film transistor structure are constituted of different films, and are overlapped with each other in certain region, therefore, a gate-source parasitic capacitance $C_{gs}$ exists between the two electrodes. Similarly, a gate and a drain of the thin film transistor structure are constituted of different films, and are also overlapped with each other in certain region, therefore, a gate-drain parasitic capacitance $C_{gd}$ exists between the two electrodes. The existence of these parasitic capacitances may affect the element properties of the thin film transistor structure, thereby affecting the display quality of the display panel.

According to the above description, thin film transistors are usually fabricated in an array. Among the current thin film transistor array processes, the majorities are employed with adjoined photomasks of a stepper exposure machine to perform an exposure process for fabricating thin film transistor arrays. Therefore, in the exposure process, the displacement offsets resulting from movements of the machine would cause nonconformity among the pattern locations formed in each exposure shot. When such offset occurs, the overlapping region of the gate and the source or the overlapping region of the gate and the drain may be different from the predetermined size. At this moment, the thin film transistors in the different exposure shots may have different parasitic capacitances $C_{gs}$ and $C_{gd}$, thereby causing nonconformity to the properties of thin film transistor, and thus the uneven brightness issue on the whole display panel is occurred during displaying.

SUMMARY

Accordingly, the invention is directed to a display panel, which may improve the poor display quality generated by the parasitic capacitance variation that is caused by the displacement offset.

The invention provides a display panel including a plurality of scan lines, a plurality of data lines, a plurality of power lines, a plurality of light emitting units, a plurality of first pixel circuits and a plurality of second pixel circuits. The plurality of light emitting units are arranged in an array, and the plurality of light emitting units are adapted to display a variety of different colors. Each of the first pixel circuits includes a first driving transistor, a first control transistor and a first storage capacitor. The first driving transistor has a first terminal, a second terminal and a third terminal. The first terminal of the first driving transistor is connected to one of the power lines, and the second terminal of the first driving transistor is connected to one of the light emitting units. The first control transistor has a first terminal, a second terminal and a third terminal. The first terminal of the first control transistor is connected to one of the data lines, the second terminal of the first control transistor is connected to the third terminal of the first driving transistor, and the third terminal of the first control transistor is connected to one of the scan lines. A terminal of the first storage capacitor is connected to the third terminal of the first driving transistor and the second terminal of the first control transistor.

Each of the second pixel circuits includes a second driving transistor, a second control transistor and a second storage capacitor. The second driving transistor has a first terminal, a second terminal and a third terminal. The first terminal of the second driving transistor is connected to one of the power lines, and the second terminal of the second driving transistor is connected to one of the light emitting units. The second control transistor has a first terminal, a second terminal and a third terminal. The first terminal of the second control transistor is connected to one of the data lines, the second terminal of the second control transistor is connected to the third terminal of the second driving transistor, and the third terminal of the second control transistor is connected to one of the scan lines. A terminal of the second storage capacitor is connected to the third terminal of the second driving transistor and the second terminal of the second control transistor. In the organic light emitting units with the same color, some parts are connected to the first pixel circuits, and other parts are connected to the second pixel circuits. Moreover, the first terminal and the second terminal of each first control transistor are sequentially arranged on a forward direction of a first direction, while the first terminal and the second terminal of each second control transistor are sequentially arranged on a reverse direction of the first direction.

In an embodiment of the invention, the first terminals and the second terminals of the first control transistors and the first terminals and the second terminals of the second control transistors are constituted of the same film.

In an embodiment of the invention, the first pixel circuits are disposed on the $(2N-1)^{th}$ row, and the second pixel circuits are disposed on the $(2N)^{th}$ row, where N is a positive integer.

In an embodiment of the invention, the first pixel circuits on the $(2N-1)^{th}$ row and the second pixel circuits on the $(2N)^{th}$ row are connected to the same scan line.

In an embodiment of the invention, the scan lines connected to the first pixel circuits on the $(2N-1)^{th}$ row and the second pixel circuits on the $(2N)^{th}$ row have the same scan signal.

In an embodiment of the invention, the light emitting units on each row include the light emitting units with at least three different colors.

In an embodiment of the invention, the two adjacent light emitting units on the same column display different colors.

In an embodiment of the invention, the light emitting units on the $(2N-1)^{th}$ row and the $(4M-3)^{th}$ column and the light emitting units on the $(2N)^{th}$ row and the $(4M-1)^{th}$ column have the same color, while the light emitting units on the $(2N-1)^{th}$ row and the $(4M-2)^{th}$ column and the light emitting units on the $(2N)^{th}$ row and the $(4M)^{th}$ column have the same color, where N and M are respectively a positive integer.

In an embodiment of the invention, the light emitting units on the $(2N-1)^{th}$ row and the $(4M-3)^{th}$ columns and the light emitting units on the $(2N)^{th}$ row and the $(4M-1)^{th}$, $(4M)^{th}$ columns are connected to odd data lines, while the light emitting units on the $(2N-1)^{th}$ row and $(4M-1)^{th}$, $(4M)^{th}$ columns and the light emitting units on the $(2N)^{th}$ row and $(4M-3)^{th}$, $(4M-2)^{th}$ columns are connected to even data lines.

In an embodiment of the invention, the light emitting units on the $(2N-1)^{th}$ row are connected to the odd data lines, while the light emitting units on the $(2N)^{th}$ row are connected to the even data lines.

In an embodiment of the invention, the light emitting units on the $(2N-1)^{th}$ row and the $(4M-3)^{th}$ column and the light emitting units on the $(2N)^{th}$ row and the $(4M-2)^{th}$ column have the same color, while the light emitting units on the $(2N-1)^{th}$ row and the $(4M-2)^{th}$ column and the light emitting units on the $(2N)^{th}$ row and the $(4M-1)^{th}$ column have the same color, where N and M are respectively a positive integer.

In an embodiment of the invention, the two adjacent light emitting units on the same row display different colors.

In an embodiment of the invention, the second terminals of the first control transistors are deviated towards the forward direction of the first direction in relative to the third terminals, and the second terminals of the second control transistors are deviated towards the forward direction of the first direction in relative to the third terminals.

In an embodiment of the invention, another terminal of the first storage capacitor is connected to the first terminal of the first driving transistor, and another terminal of the second storage capacitor is connected to the first terminal of the second driving transistor.

In an embodiment of the invention, another terminal of the first storage capacitor is connected to the second terminal of the first driving transistor, and another terminal of the second storage capacitor is connected to the second terminal of the second driving transistor.

In an embodiment of the invention, the light emitting unit includes an organic light emitting unit.

Based on the above descriptions, in the display panel of the invention, the first terminal and the second terminal (constituted by the same film) of the first control transistor are sequentially arranged on the forward direction of the first direction, and the first terminal and the second terminal (constituted by the same film) of the second control transistor are sequentially arranged on the reverse direction of the first direction. In this way, when the position of a photomask for forming the first and second terminals of the transistors occurs an offset on the first direction during a manufacturing process, the deviated locations of the first terminal and the second terminal of the first control transistor in relative to the location of the third terminal of the first control transistor may compensate the deviated locations of the first terminal and the second terminal of the second control transistor in relative to the location of the third terminal of the second control transistor. Therefore, the parasitic capacitance variations are generated in the two control transistors (that is due to the photomask offset in the manufacturing process), where the parasitic capacitance variation of one control transistor is increased and the parasitic capacitance variation of another control transistor is decreased, thereby compensating with each other. In the embodiments of the invention, the control circuit for driving the light emitting units with the same color concurrently includes the two aforementioned control transistors, and the display panel may still have the uniform display quality, even if the photomask occurs a location offset during the manufacturing process.

In order to make the features and advantages of the present invention more comprehensible, the present invention is further described in detail in the following with reference to the embodiments and the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 11 is another driving circuit diagram for a first pixel circuit.

FIG. 12A is a schematic top view partially illustrating a first control transistor of another embodiment.

FIG. 12B is a schematic top view partially illustrating a second control transistor of the embodiment in FIG. 12A.

DESCRIPTION OF THE EMBODIMENTS

The following individual drawings have adjusted the proportion of every element, so that each individual element may be presented distinctly. As such, the size of every element is not illustrated with the actual proportion. In addition, the following drawings, in some parts, may only illustrate some elements in the display panel for simplifying drawings.

Figure 1:
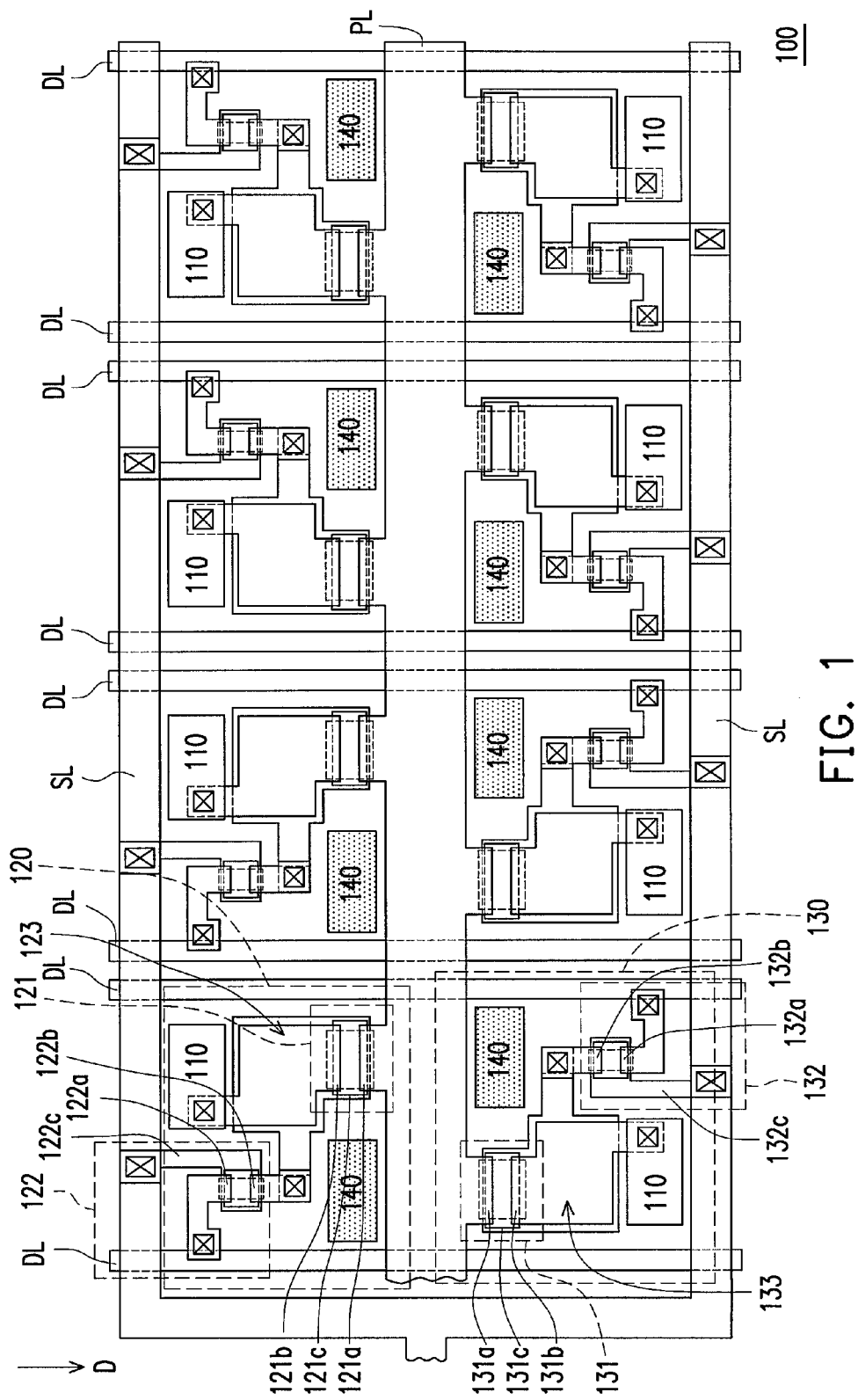
FIG. 1 is a schematic top view illustrating a display panel according to a first embodiment of the invention.

FIG. 1 is a schematic top view illustrating a display panel according to a first embodiment of the invention. Referring to FIG. 1, the display panel 100 includes a plurality of scan lines SL, a plurality of data lines DL, a plurality of power lines PL, a plurality of light emitting units 110, a plurality of first pixel circuits 120 and a plurality of second pixel circuits 130. The light emitting units 110 are arranged in an array. The first pixel circuits 120 are connected to the corresponding scan lines SL, data lines DL and power lines PL, furthermore, some parts of the light emitting units 110 are connected to the first pixel circuits 120. The second pixel circuits 130 are connected to the corresponding scan lines SL, data lines DL and power lines PL, furthermore, the rest of the light emitting units 110 are connected to the second pixel circuits 130.

The display panel 100 is substantially employed with two kinds of pixel circuit 120 and 130 to drive the light emitting units 110. Furthermore, the first pixel circuits 120 and the second pixel circuits 130, here, are formed in different rows. In other words, when the first pixel circuits 120 are configured to drive the light emitting units 110 on odd rows, the second pixel circuits 130 are configured to drive the light emitting units 110 on even rows, or when the first pixel circuits 120 are configured to drive the light emitting units 110 on the even rows, the second pixel circuits 130 are configured to drive the light emitting units 110 on odd rows. Moreover, in the embodiment, the $(2N)^{th}$ scan lines SL, for example, may be selectively connected with the $(2N-1)^{th}$ scan lines, such that the first pixel circuits 120 and the second pixel circuits 130 on the two adjacent rows are controlled by the same scan signal.

Figure 2:
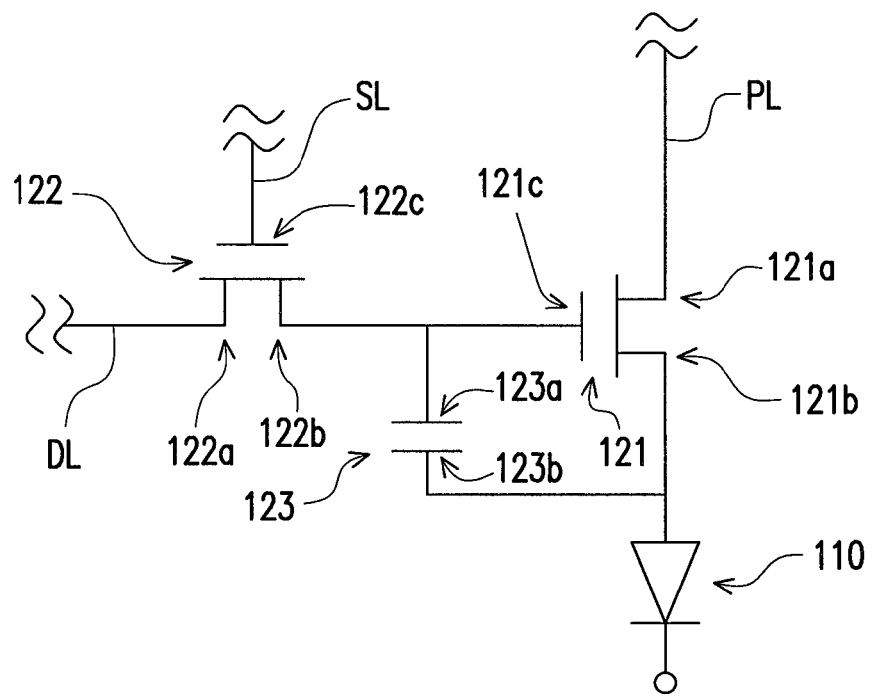
FIG. 2 is a circuit diagram illustrating a first pixel circuit in FIG. 1.

FIG. 2 is a circuit diagram illustrating a first pixel circuit in FIG. 1. Referring to FIG. 1 and FIG. 2 together, the first pixel circuit 120 includes a first driving transistor 121, a first control transistor 122 and a first storage capacitor 123. The first driving transistor 121 has a first terminal 121a, a second terminal 121b and a third terminal 121c. The first terminal 121a of the first driving transistor 121 is connected to one of the power lines PL, and the second terminal 121b of the first driving transistor 121 is connected to one of the light emitting units 110. The first control transistor 122 has a first terminal 122a, a second terminal 122b and a third terminal 122c. The first terminal 122a of the first control transistor 122 is connected to one of the data lines DL, the second terminal 122b of the first control transistor 122 is connected to the third terminal 121c of the first driving transistor 121, and the third terminal 122c of the first control transistor 122 is connected to one of the scan lines SL. A terminal 123a of the first storage capacitor 123 is connected to the third terminal 121c of the first driving transistor 121 and the second terminal 122b of the first control transistor 122. In an embodiment, the first control transistor 122 and the first driving transistor 121 may be N-type transistors. At this moment, another terminal 123b of the first storage capacitor 123 may be connected between the second terminal 121b of the first driving transistor 121 and the light emitting unit 110.

Figure 3:
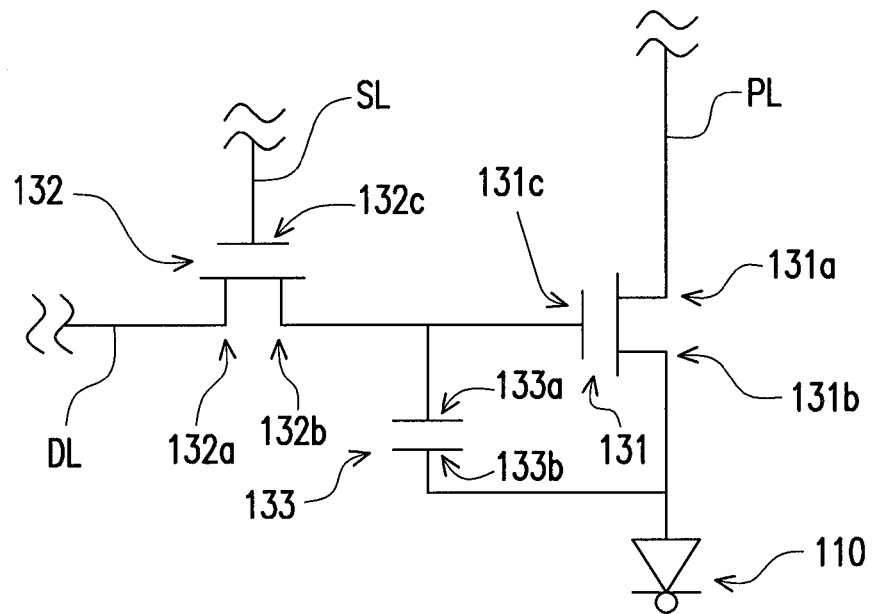
FIG. 3 is a circuit diagram illustrating a second pixel circuit in FIG. 1.

FIG. 3 is a circuit diagram illustrating a second pixel circuit in FIG. 1. In the embodiment, the circuit design of the second pixel circuit 130 is substantially the same as the first pixel circuit 120. Referring to FIG. 1 and FIG. 3, the second pixel circuit 130 includes a second driving transistor 131, a second control transistor 132 and a second storage capacitor 133. The second driving transistor 131 has a first terminal 131a, a second terminal 131b and a third terminal 131c. The first terminal 131a of the second driving transistor 131 is connected to one of the power lines PL, and the second terminal 131b of the second driving transistor 131 is connected to one of the light emitting units 110. The second control transistor 132 has a first terminal 132a, a second terminal 132b and a third terminal 132c. The first terminal 132a of the second control transistor 132 is connected to one of the data lines DL, the second terminal 132b of the second control transistor 132 is connected to the third terminal 131c of the second driving transistor 131, and the third terminal 132c of the second control transistor 132 is connected to one of the scan lines SL. A terminal 133a of the second storage capacitor 133 is connected to the third terminal 131c of the second driving transistor 131 and the second terminal 132b of the second control transistor 132. In an embodiment, the second control transistor 132 and the second driving transistor 131 may be N-type transistors. At this moment, the second terminal 133b of the second storage capacitor 133 may be connected between the second terminal 131b of the second driving transistor 131 and the light emitting unit 110.

In the first pixel circuit 120, when the first control transistor 122 is turned on, a data voltage transmitted through the data line DL is applied on the third terminal 121c of the first driving transistor 121. When the first control transistor 122 is turned off, the data voltage applied on the third terminal 121c of the first driving transistor 121 is maintained by the first storage capacitor 123. At this moment, the turn-on of the first driving transistor 121 may control the driving current flowing through the light emitting unit 110 from the power line PL. Therefore, under such design of driving circuit, the turn-on or turn-off of the first control transistor 122 has the function of controlling the data voltage to write into, while the turn-on or turn-off of the first driving transistor 121 has the function of controlling the driving current. In addition, in the second pixel circuit 130, the functions of the second control transistor 132 and the second driving transistor 131 are similar to the first control transistor 122 and the first driving transistor 121 in the first pixel circuit 120 described above, therefore will not be described again herein.

In the embodiment, the driving circuit with the framework of two transistors and a capacitor (2T1C) is exemplified to describe the first pixel circuit 120 and the second pixel circuit 130, however, the invention is not limited to the coupling method and the amount of transistors and capacitors in the pixel circuits. The designer may modify the coupling method and the amount of transistors and capacitors in the pixel circuits according to the actual application requirement, such as modifying to a pixel circuit with the framework of four transistors and two capacitors (4T2C) to drive the light emitting units. At this moment, the pixel circuit with the framework of four transistors and two capacitors, other than having the similar data lines, scan lines, power lines, capacitors, control transistors and driving transistors in the first pixel circuit 120 and the second pixel circuit 130, may also selectively have other elements 140 (as illustrated in FIG. 1). In other words, the connection relationship and the structural design for these elements (namely, the data lines, the scan lines, the power lines, the capacitors, the control transistors and the driving transistors etc.) described in the embodiment may be utilized in the driving circuit with the framework of 4T2C or other frameworks.

Referring to FIG. 1, in the embodiment, the first terminal 122a and the second terminal 122b of the first control transistor 122 and the first terminal 132a and the second terminal 132b of the second control transistor 132 are constituted of the same film. Namely, the first terminals 122a, 132a and the second terminals 122b, 132b are fabricated in the same exposure process during the manufacturing process of the display panel 100. Moreover, the third terminal 122c of the first control transistor 122 and the third terminal 132c of the second control transistor 132 are fabricated with the same film, but the film layer of the third terminals 122c, 132c is different from the film layer of the aforementioned first terminals 122a, 132a and second terminals 122b, 132b. Therefore, in the exposure process of fabricating the first control transistor 122 and the second control transistor 132, the displacement offset of the photomasks may cause the relative locations of the third terminals 122c, 132c and the first terminals 122a, 132a different from the predetermined locations. Similarly, the relative locations of the third terminals 122c, 132c and the second terminals 122b, 132b may also have such offset.

In each of the first pixel circuits 120, the first terminal 122a and the second terminal 122b of the first control transistor 122 are sequentially arranged on a forward direction of a first direction D as shown as the arrow. In each of the second pixel circuits 130, the first terminal 132a and the second terminal 132b of the second control transistor 132 are sequentially arranged on a reverse direction of the first direction D. In the embodiment, the first direction D is, for example, defined as the main data transmission direction that the first control transistor 122 of the first pixel circuit 120 transmits the data from the data lines DL.

In other words, in the embodiment, the forward direction of the first direction D is defined as the first terminal 122a is relatively located above the second terminal 122b and the first terminal 132a is relatively located below the second terminal 132b when the direction is from the top to the bottom of FIG. 1. During the manufacturing process, when the second terminal 122b of the first control transistor 122 is deviated from a predetermined location towards the forward direction of the first direction D in relative to the third terminal 122c, the location of the second terminal 122b may be away from the centre of the third terminal 122c in relative to the predetermined location. When the second terminal 132b of the second control transistor 132 is also deviated from a predetermined location towards the forward direction of the first direction D in relative to the third terminal 132c, the location of the second terminal 132b may be further close to the centre of the third terminal 132c in relative to the predetermined location.

At this moment, the overlapping area between the second terminal 122b and the third terminal 122c of the first control transistor 122 may be reduced in relative to the predetermined design, while the overlapping are between the second terminal 132b and the third terminal 132c of the second control transistor 132 may be increased in relative to the predetermined design. Accordingly, the parasitic capacitance between the second terminal 122b and the third terminal 122c of the first control transistor 122 and the parasitic capacitance between the second terminal 132b and the third terminal 132c of the second control transistor 132 may be compensated with each other. Similarly, the parasitic capacitance between the first terminal 122a and the third terminal 122c of the first control transistor 122 and the parasitic capacitance between the first terminal 132a and the third terminal 132c of the second control transistor 132 may be compensated with each other.

The first terminal 122a and the second terminal 122b of the first control transistor 122 are sequentially arranged on the forward direction of the first direction D in the first pixel circuit 120, and the first terminal 132a and the second terminal 132b of the second control transistor 132 are sequentially arranged on the reverse direction of the first direction D in the second pixel circuit 130. Therefore, when the offset occurs, the deviated locations in relative to the locations of every component in the first control transistor 122 and the second control transistor 132 may be compensated with each other. At this moment, the element properties of the first control transistor 122 and the second control transistor 132 may be changed in a reverse way.

For example, once the offset occurs, the light emitting units 110 driven by the first pixel circuits 120 appears to increase the brightness in relative to the predetermined brightness, while the light emitting units 110 driven by the second pixel circuits 130 may appear to decrease the brightness in relative to the predetermined brightness. In this way, when the light emitting units 110 with the same color are driven by both the first pixel circuits 120 and the second pixel circuits 130, the display brightness of this color in the entire display panel 100 may be compensated with each other, thereby achieving the ideal display uniformity. It should be mentioned that, the first direction D in the embodiment is exemplified by the extending direction parallel to the data lines DL to describe herein. However, in other embodiments, the first direction D may be assigned to be the direction that the displacement offset is relatively easy to occur or the direction that the displacement offset is greater degree in the exposure process. Moreover, the following description may be incorporated with the accompanying drawings to further describe the layout design of the display panel 100 in the embodiment.

Figure 4:
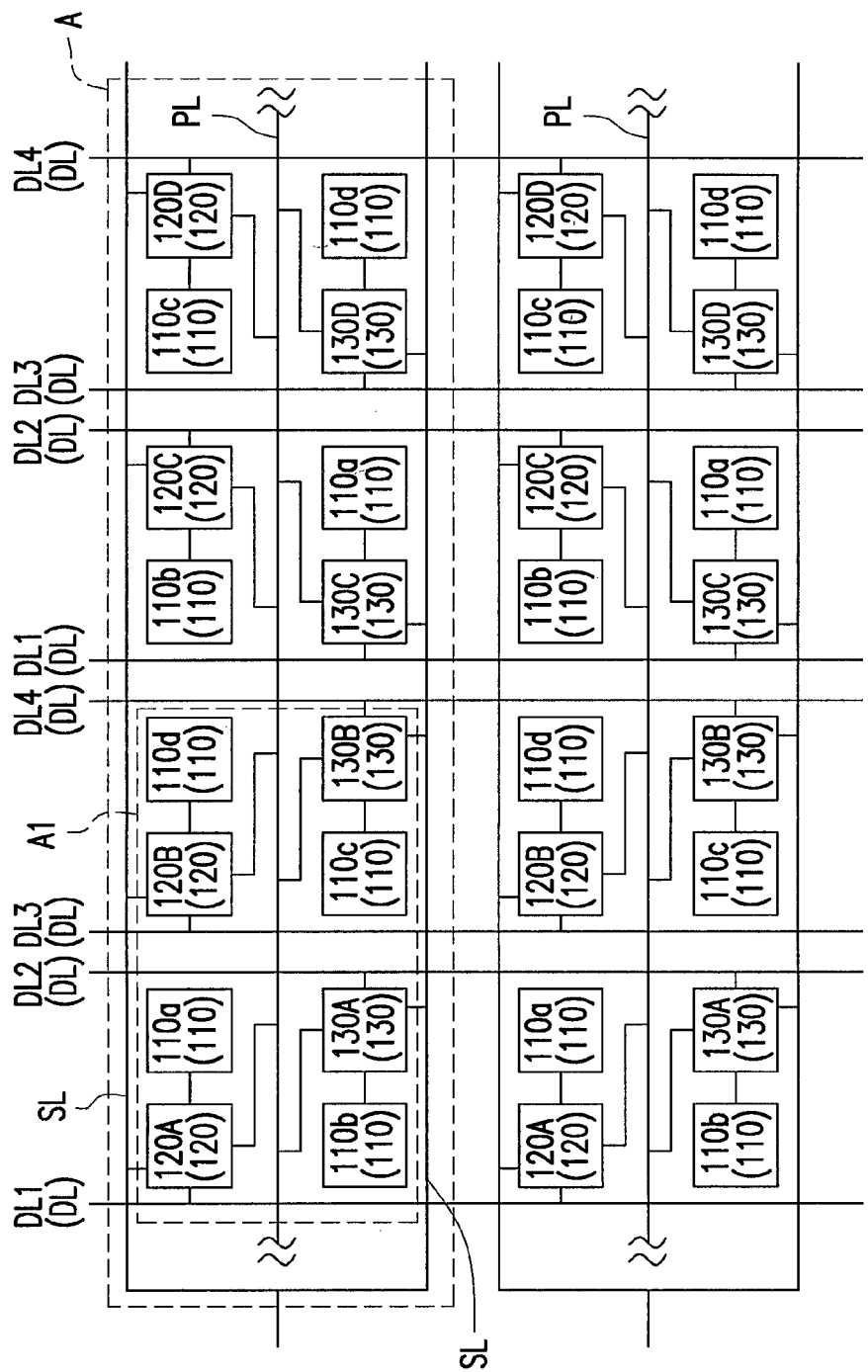
FIG. 4 is a schematic layout diagram illustrating a display panel in FIG. 1.

FIG. 4 is a layout diagram illustrating a display panel in FIG. 1, wherein FIG. 4 only illustrates the pixels circuits and the light emitting units schematically. Referring to FIG. 4, the plurality of light emitting units 110 on the display panel 100 are adapted to display a variety of different colors. In the embodiment, the light emitting units 110 appearing in four colors (such as red, green, blue and white) are exemplified. In other words, the light emitting units 110 are exemplified by including the four types such as the red light emitting unit 110a, the green light emitting unit 110b, the blue light emitting unit 110c and the white light emitting unit 110d to describe herein. However, in other embodiments, the colors displayed by the light emitting units 110 may only selectively include three different colors. Moreover, other than the primary colors of red, green and blue (RGB) described above, in other embodiments, the colors displayed by the light emitting units 110 may include the primary colors of magenta, cyan, and yellow or other combinations of different colors.

In the light emitting units 110 with the same color of the display panel 100, some parts of the light emitting units 110 are connected to the first pixel circuits 120, and other parts are connected to the second pixel circuits 130. Thus, once the displacement occurs in the manufacturing process, the display effect of the display panel 100 is obtained the self-compensation effect. For example, in FIG. 4, the first pixel circuits 120 on the same row sequentially includes the first pixel circuits 120A, the first pixel circuits 120B, the first pixel circuit 120C and the first pixel circuits 120D. The second pixel circuits 130 on the same row sequentially include the second pixel circuits 130A, the second pixel circuits 130B, the second pixel circuits 103C and the second pixel circuits 130D. At this moment, among the light emitting units 110 on the two adjacent rows, the red light emitting units 110a on one row are connected with the first pixel circuits 120A, while the red light emitting units 110a on the other row are connected with the second pixel circuits 130C. Likewise, the green light emitting units 110b on one row are connected with the first pixel circuits 120C, while the green light emitting units 110b on the other row are connected with the second pixel circuits 130A. The blue light emitting units 110c on one of the rows are connected with the first pixel circuits 120D, while the blue light emitting units 110c on the other row are connected with the second pixel circuits 130B. The white light emitting units 110d on one of the rows are connected with the first pixel circuits 120B, while the white light emitting units 110d on the other row are connected with the second pixel circuits 130D.

To be specific, in the embodiment, one of the red light emitting units 110a is connected with the first pixel circuit 120A, while another one of the red light emitting units 110a is connected with the second pixel circuit 130C. According to FIG. 1, the first terminal 122a and the second terminal 122b of the first control transistor 122 are sequentially arranged on the forward direction of the first direction D in the first pixel circuits 120, and the first terminal 132a and the second terminal 132b of the second control transistor 132 are sequentially arranged on the reverse direction of the first direction D in the second pixel circuits 130. In this way, it is assumed that when some parts of the red light emitting units 110a connected with the first pixel circuits 120 become brighter due to the parasitic capacitance, the other parts of the red light emitting units 110a connected with the second pixel circuits 130 may become darker, such that both parts may have the effect of compensating with each other. Similarly, among the plurality of green light emitting units 110b, blue light emitting units 110c and white light emitting units 110d, the light emitting units 110 with the same color have some parts connecting with the first pixel circuits 120 and other parts connecting to the second pixel circuits 130. Therefore, the plurality of light emitting units 110 with the same color may also have the same compensation effect as the aforementioned red light emitting units 110a, so that the display panel 100 has the fine display quality.

Referring to FIG. 4, in the embodiment, the two adjacent light emitting units 110 on the same row are the light emitting units 110 displaying different colors. In addition, the light emitting units 110 on each row include the light emitting units 110 with all the colors, and the two adjacent light emitting units 110 on the same row may also display different colors. Therefore, the light emitting units 110 with the same color may not be disposed collectively, such that the display panel 100 may not easily have the phenomenon of inconsistent color distribution.

Moreover, in the embodiment, the first pixel circuits 120 are all disposed on the $(2N-1)^{th}$ row and the second pixel circuits 130 are all disposed on the $(2N)^{th}$ row, where N is a positive integer. The arrangement of each row in FIG. 4 is exemplified, the plurality of light emitting units 110 on the $(2N-1)^{th}$ row are sequentially the red light emitting units 110a, the white light emitting units 110d, the green light emitting units 110b and the blue light emitting units 110c. The plurality of light emitting units 110 on the $(2N)^{th}$ row are sequentially the green light emitting units 110b, the blue light emitting units 110c, the red light emitting units 110a and the white light emitting units 110d.

In terms of the arrangement of columns, the plurality of light emitting units 110 on the $(2M-1)^{th}$ column are sequentially the red light emitting units 110a and the green light emitting units 110b, where the two colors are staggered and M is a positive integer. The plurality of light emitting units 110 on the $(2M)^{th}$ column are the white light emitting units 110d and the blue light emitting units 110c, where the two colors are also staggered.

Referring to FIG. 4, in the embodiment, the light emitting units 110 on the $(2N-1)^{th}$ row and the $(4M-3)^{th}$ column have the same color as the light emitting units 110 on the $(2N)^{th}$ row and the $(4M-1)^{th}$ column. The light emitting units 110 on the $(2N-1)^{th}$ row and the $(4M-2)^{th}$ column have the same color as the light emitting units 110 on the $(2N)^{th}$ row and the $(4M)^{th}$ column. Moreover, the light emitting units 110 on the $(2N)^{th}$ row and the $(4M-3)^{th}$ column have the same color as the light emitting units 110 on the $(2N-1)^{th}$ row and the $(4M-1)^{th}$ column. The light emitting units 110 on the $(2N)^{th}$ row and the $(4M-2)^{th}$ column have the same color as the light emitting units 110 on the $(2N-1)^{th}$ row and the $(4M)^{th}$ column. For example, when N=1 and M=1, the first row and the first column is the red light emitting unit 110a, the second row and the third column is also the red light emitting unit 110a. Moreover, the first row and the second column is the white light emitting unit 110d, the second row and the fourth column is also the white light emitting unit 110d.

In the embodiment, for example, eight light emitting units 110 are taken as a group to form a repeat unit A, as shown in FIG. 4. The eight light emitting units 110 are arranged into two rows and four columns, and the eight light emitting units 110 include the light emitting units 110 with four different colors. Namely, each color in the group (the repeat unit A) has two light emitting units 110. The colors for the first row are sequentially the red light emitting unit 110a, the white light emitting unit 110d, the green light emitting unit 110b and the blue light emitting unit 110c. The plurality of light emitting units 110 on the second row are sequentially the green light emitting unit 110b, the blue light emitting unit 110c, the red light emitting unit 110a and the white light emitting unit 110d.

Specifically, the repeat unit A includes two sub units A1, wherein each sub unit A1 includes four light emitting units 110. The four light emitting units 110 are arranged into two rows and two columns, and the colors of the four light emitting units 110 are not repeated. The two same sub units A1 are arranged side by side to constitute a repeat unit A. Such repeat units A are incorporated with the corresponding data lines DL, scan lines SL and power lines PL to constitute the pixel array in the display panel 100.

According to the above descriptions, the plurality of light emitting units 110 on the $(2N-1)^{th}$ row are connected with the first pixel circuits 120, and the plurality of light emitting units 110 on the $(2N)^{th}$ row are connected with the second pixel circuits 130. Under such configuration manner, when the locations of photomasks have the displacement offset in the fabrication of the display panel 100, the red light emitting unit 110a, the white light emitting unit 110d, the green light emitting unit 110b and the blue light emitting unit 110c on the first row may have the compensation effect with the red light emitting unit 110a, the white light emitting unit 110d, the green light emitting unit 110b and the blue light emitting unit 110c on the second row.

In addition, in the first embodiment, the scan lines SL connected to the first pixel circuits 120 on the $(2N-1)^{th}$ row and the second pixel circuits 130 on the $(2N)^{th}$ row may have the same scan signal. FIG. 1 and FIG. 4 are exemplified that the scan line SL connected to the first pixel circuits 120 on the $(2N-1)^{th}$ row and the scan line SL connected to the second pixel circuits 130 on the $(2N)^{th}$ row may be connected with each other. Therefore, the first pixel circuits 120 on the $(2N-1)^{th}$ row and the second pixel circuits 130 on the $(2N)^{th}$ row may be driven by the same scan signal.

Moreover, the light emitting units 110 on the $(2N-1)^{th}$ row and the light emitting units 110 on the $(2N)^{th}$ row, for example, are connected to different data line DL. In the first embodiment, the light emitting units 110 on the $(2N-1)^{th}$ row and the $(4M-3)^{th}$, $(4M-2)^{th}$ columns, and the light emitting units 110 on the $(2N)^{th}$ row and the $(4M-1)^{th}$, $(4M)^{th}$ columns, for example, are all connected to the odd data lines DL, while the light emitting units 110 on the $(2N-1)^{th}$ row and the $(4M-1)^{th}$, $(4M)^{th}$ columns, and the light emitting units 110 on the (2N) row and the $(4M-3)^{th}$, $(4M-2)^{th}$ columns are all connected to the even data lines DL.

In this way, referring to FIG. 4, one of the sub units A1 in the repeat unit A composed by a group of eight light emitting units 110 may be electrically connected to the data lines DL1, DL2, DL3 and DL4. To be specific, the data lines DL1, DL2, DL3 and DL4 may be selectively and respectively connected to the red light emitting units 110a, the green light emitting units 110b, the blue light emitting units 110c and the white light emitting units 110d. In other words, the $(4M-3)^{th}$ data line DL is configured to transmit the red signal, the $(4M-2)^{th}$ data line DL is configured to transmit the green signal, the $(4M-1)^{th}$ data line DL is configured to transmit the white signal and the $(4M)^{th}$ data line DL is configured to transmit the blue signal. However, the invention is not limited thereto.

It should be noted that, the arrangement order of the red light emitting units 110a, the green light emitting units 110b, the blue light emitting units 110c and the white light emitting units 110d in the embodiment may be not limited thereto. Although the red light emitting unit 110a is on the first row and the first column, the green light emitting unit 110b is on the second row and the first column, the white light emitting unit 110d is on the first row and the second column and the blue light emitting unit 110c is on the second row and the second column in the sub unit A1, the arrangement order of each color may be exchanged. For example, the green light emitting unit 110b is changed onto the first row and the first column, the white light emitting unit 110d is changed onto the second row and the first column, the red light emitting unit 110a is changed onto the first row and the second column, and the blue light emitting unit 110c is changed onto the second row and the second column.

Figure 5:
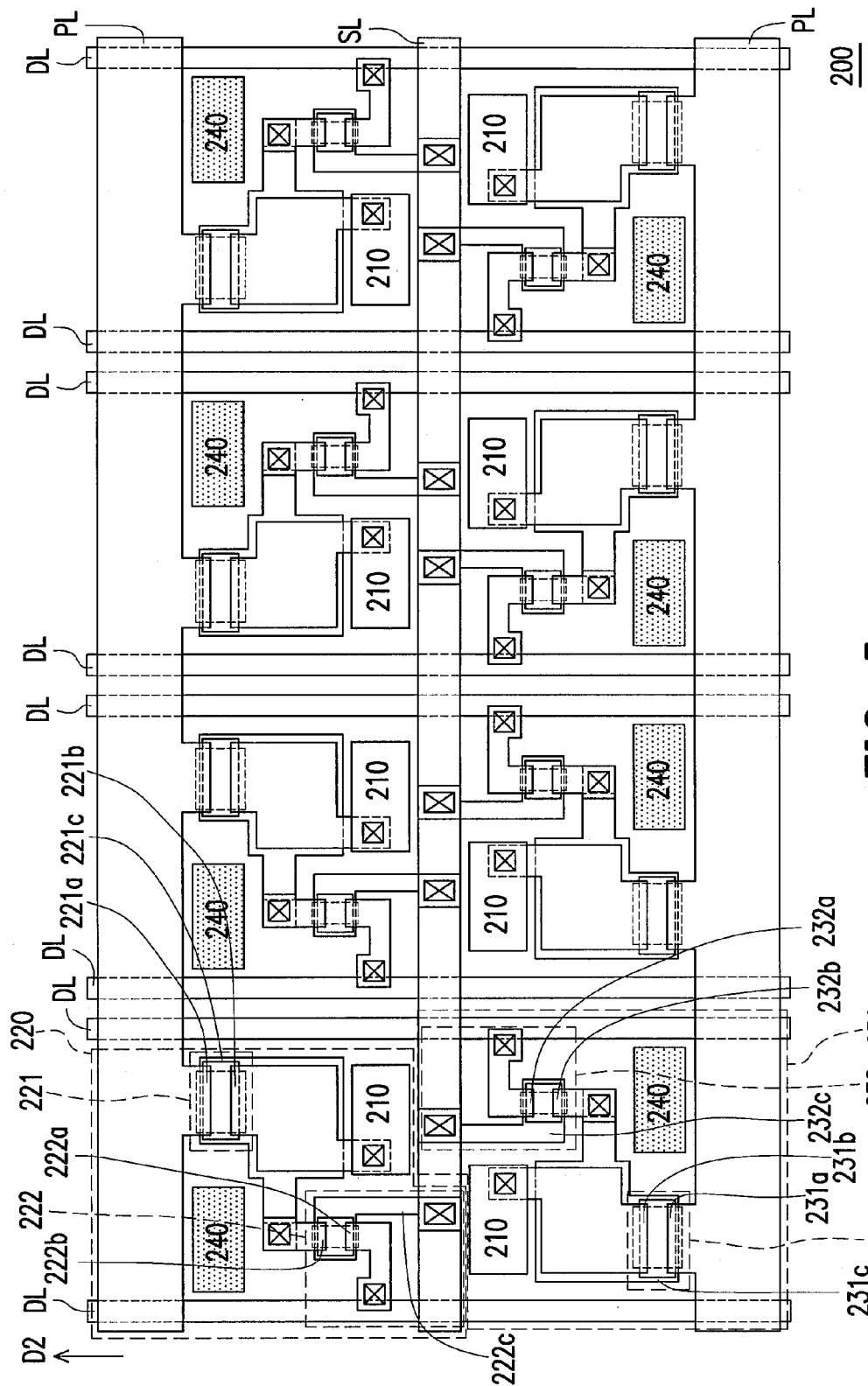
FIG. 5 is a schematic top view illustrating a display panel according to a second embodiment of the invention.

FIG. 5 is a schematic top view illustrating a display panel according to a second embodiment of the invention. Referring to FIG. 5, the second embodiment is substantially similar to the first embodiment. The main difference between the two embodiments lies in that the first pixel circuit 220 and the second pixel circuit 230 on the two adjacent rows are connected to the same scan line SL, in the second embodiment.

Since the first pixel circuit 220 and the second pixel circuit 230 on the two adjacent rows are shared the same scan line SL, the third terminal 222c of the first control transistor 222 in the first pixel circuit 220 and the third terminal 232c of the second control transistor 232 in the second pixel circuit 230 both are connected to the same scan line SL. Therefore, in order to incorporate with the location of the scan line SL, in the second embodiment, the arrangement of the first driving transistor 221 and the first control transistor 222 in the pixel circuit 220 and the second driving transistor 231 and the second control transistor 232 in the pixel circuit 230, may be different from the first embodiment.

Here, the definition of the first direction D2 is the same as the first embodiment, which is the main data transmission direction that the first control transistor 122 in the first pixel circuit 220 transmits the data from the data lines DL. Referring to FIG. 5, in the embodiment, the forward direction of the first direction D2 is defined as the first terminal 222a is relatively located below the second terminal 222b and the first terminal 232a is relatively located above the second terminal 232b when the direction directs from the bottom to the top.

Accordingly, it is the same as the first embodiment described above that during the manufacturing process, when the second terminal 222b of the first control transistor 222 is deviated from a predetermined location towards the forward direction of the first direction D2 in relative to the third terminal 222c, the second terminal 232b of the second control transistor 232 is also deviated from a predetermined location towards the forward direction of the first direction D2 in relative to the third terminal 232c. Therefore, when the first control transistor 222 and the second control transistor 232 are disposed in the manner as described in the embodiment and an offset is generated in the display panel 200, the compensation effect similar to the first embodiment may be achieved.

Figure 6:
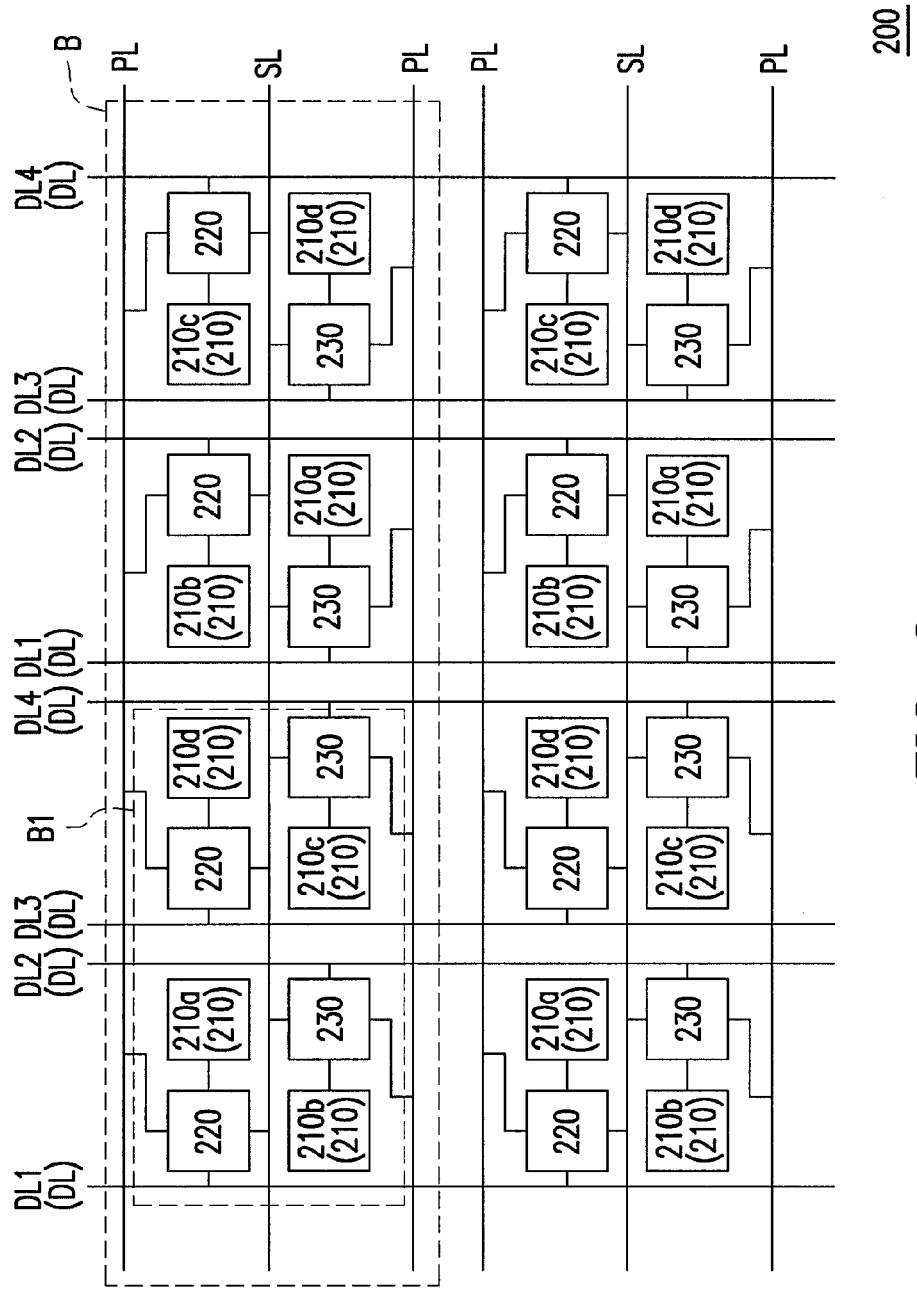
FIG. 6 is a schematic layout diagram illustrating a display panel in FIG. 5.

FIG. 6 is a layout diagram illustrating a display panel in FIG. 5. Referring to FIG. 6, to be specific, the second embodiment is the same as the first embodiment, which is exemplified by the light emitting units 210 appearing in red, green, blue and white four different colors. In other words, the light emitting units 210 including the red light emitting units 210a, the green light emitting units 210b, the blue light emitting units 210c, and the white light emitting units 210d, are exemplified to describe herein. Certainly, it is the same as the first embodiment described above, where the colors of the light emitting units 210 are not limited to the combination of red, green, blue and white, it is possible to have combinations of other colors.

Similarly, in the second embodiment, the organic light emitting units 210 with the same color are designed as that some parts are connected to the first pixel circuits 220, while other parts are connected to the second pixel circuits 230. As described in the aforementioned embodiment, the arrangements of the first terminal 222a and the second terminal 222b of the first control transistor 222 and the first terminal 232a and the second terminal 232b of the second control transistor 232 on the first direction D2 are incorporated to compensate the parasitic capacitance variation caused by the displacement offset of photomasks in the fabrication.

In addition, a repeat unit B is formed by taking eight light emitting units 210 from the light emitting units 210 in the display panel 200 as a group, and the repeat units B are repeatedly arranged. Furthermore, a repeat unit B is constituted by arranging the two same sub units B1 side by side, wherein the color combination and the arrangement are the same as the first embodiment, and thus the detailed description thereof are omitted hereby. It should be noted that, the arrangement of the light emitting units 210a, 210b, 210c and 210d with different colors in a sub unit B1 is utilized as an example to describe the embodiment, and the designer may modify the arrangement of the light emitting units according to the actual situation.

Here, it is the same as the first embodiment, where in each of the sub units B1 having four light emitting units 210, the red light emitting unit 210a is electrically connected to the data line DL1, the green light emitting unit 210b is electrically connected to the data line DL2, the blue light emitting unit 210c is electrically connected to the data line DL4, and the white light emitting unit 210d is electrically connected to the data line DL3. Therefore, the signal transmission method is the same as the first embodiment.

Figure 7:
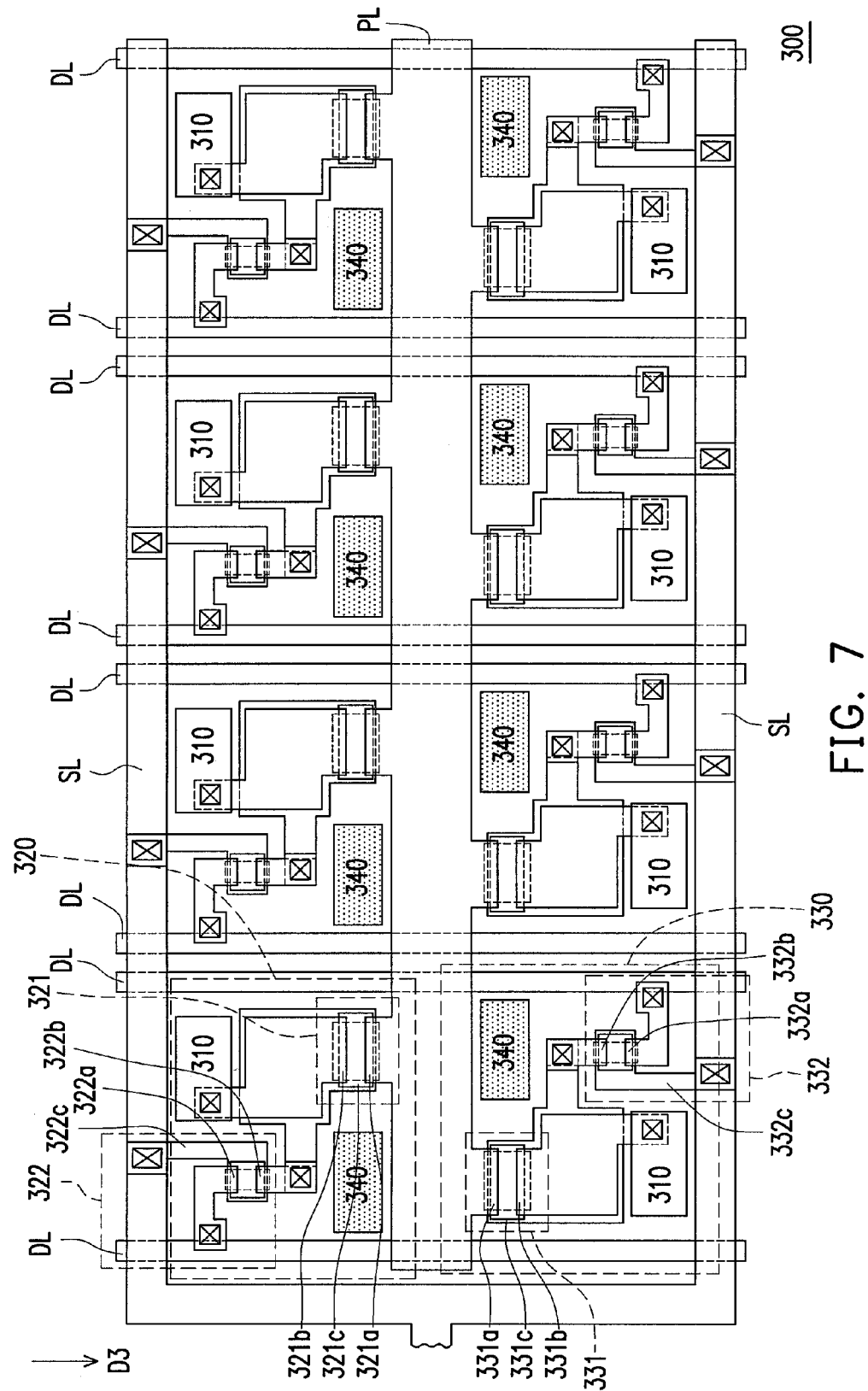
FIG. 7 is a schematic top view illustrating a display panel according to a third embodiment of the invention.

FIG. 7 is a schematic top view illustrating a display panel according to a third embodiment of the invention. Referring to FIG. 7, the third embodiment is substantially similar to the first embodiment. The main difference between the two embodiments lies in that the light emitting units 310 on the $(2N-1)^{th}$ row are connected to the odd data lines DL and the light emitting units 310 on the $(2N)^{th}$ row are connected to the even data lines DL, in the third embodiment.

When the configuration as illustrated in FIG. 7 is utilized to describe the embodiment, that is, each of the light emitting units 310 on the first row is respectively connected to the first data line DL, the third data line DL, the fifth data line DL and the seventh data line DL, while the light emitting units on the second row are respectively connected to the second data line DL, the fourth data line DL, the sixth data line DL and the eighth data line DL.

Figure 8:
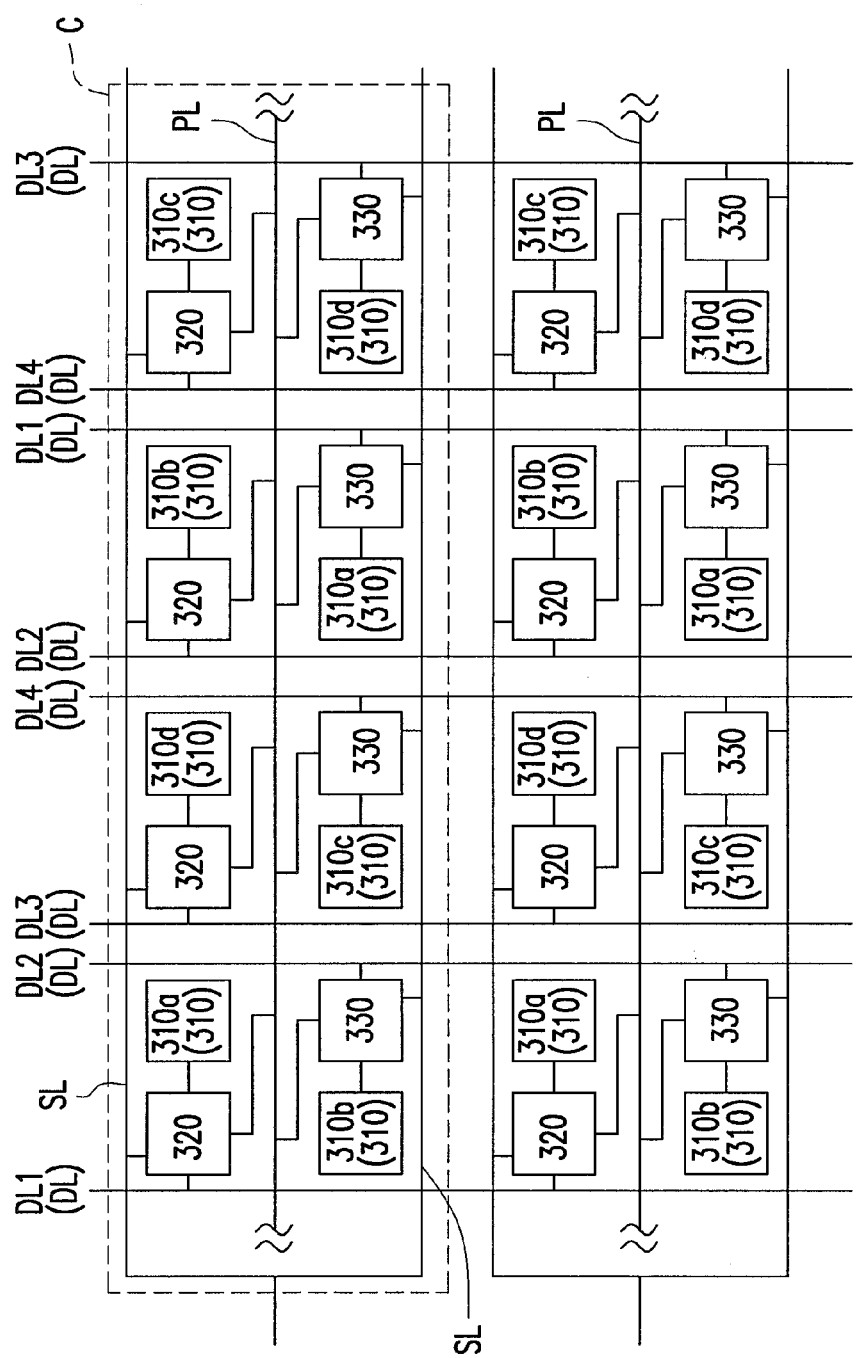
FIG. 8 is a schematic layout diagram illustrating a display panel in FIG. 7.

Referring to FIG. 8, similarly, eight light emitting units 310 are taken as a group to form a repeat unit C as shown in FIG. 8, in the third embodiment. The color combination and the arrangement of the light emitting units are the same as the first embodiment. However, in the third embodiment, the light emitting units 310 on the $(2N-1)^{th}$ row are connected to the odd data lines DL and the light emitting units 310 on the $(2N)^{th}$ row are connected to the even data lines DL. Therefore, in order for the red light emitting units 310a to be electrically connected to the data line DL1, the green light emitting units 310b are electrically connected to the data line DL2, the white light emitting units 310d are electrically connected to the data line DL3 and the blue light emitting units 310c are electrically connected to the data line DL4 in a repeat unit C, where the arrangement of the data lines DL is different from the aforementioned embodiments. Specifically, the arrangement of the data lines DL as shown in FIG. 8, for example, are taken the data line DL1, the data line DL2, the data line DL3, the data line DL4, the data line DL2, the data line DL1, the data line DL4 and the data line DL3 as a group, and the eight data lines DL are arranged repeatedly. Certainly, the signal transmission for the data lines of the embodiment is different from the first embodiment and the second embodiment as described above, but the effect of compensating with each other between the light emitting units 310 with the same color may still be implemented when the displacement offset of photomasks is generated in the fabrication of the display panel 300.

Figure 9:
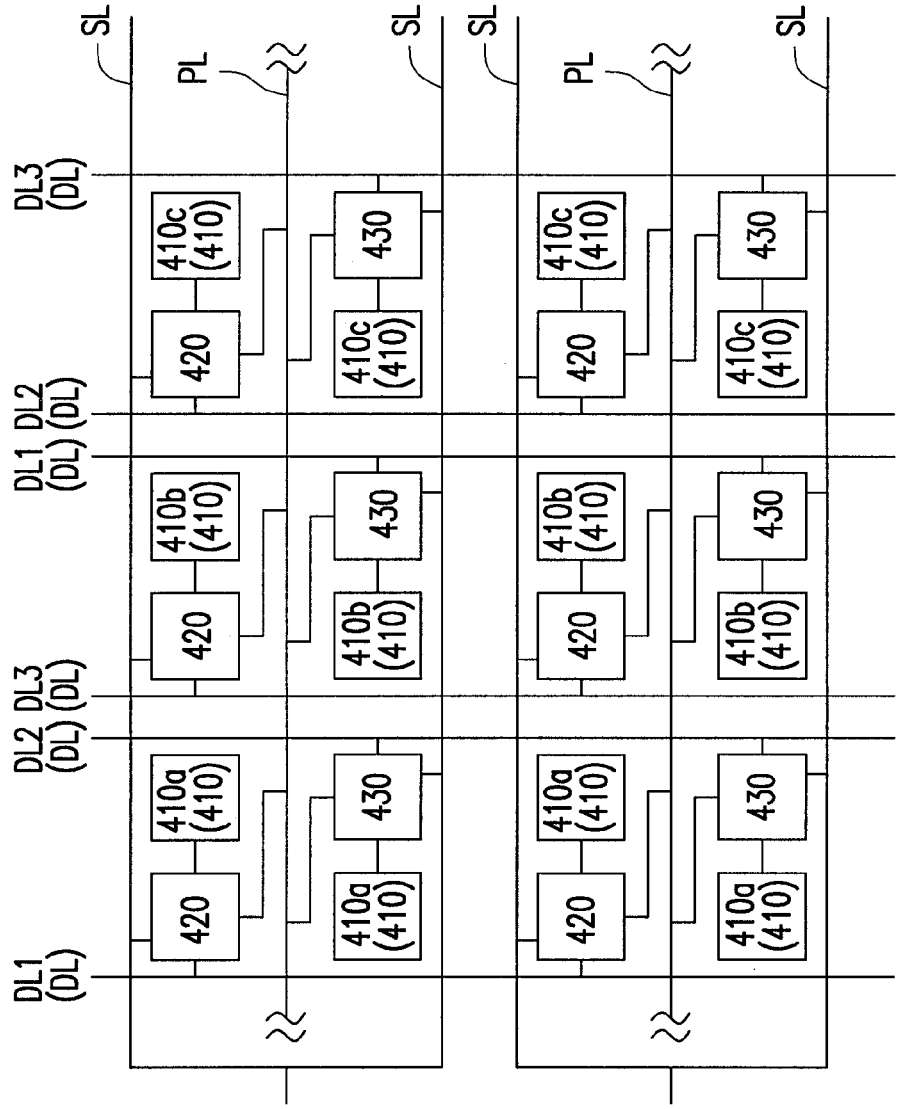
FIG. 9 is a schematic layout diagram illustrating a display panel according to a fourth embodiment of the invention.

FIG. 9 is a layout diagram illustrating a display panel according to a fourth embodiment of the invention. The aforementioned embodiments are exemplified by the light emitting units with the total of four colors, but the invention is not limited thereto. In the fourth embodiment, the light emitting units 410 including the red light emitting units 410a, the green light emitting units 410b and the blue light emitting units 410c are exemplified to describe herein. The layout of the fourth embodiment (such as the first pixel circuit 420, the second pixel circuit 430, the scan lines SL, the data lines DL and the power lines PL etc.) is similar to the first embodiment. The difference between the two embodiments lies in that the light emitting units in the fourth embodiment only have three different types, and the arrangement of the light emitting units 410 is different from the first embodiment as described above.

In the fourth embodiment, the light emitting units 410 on the same row are arranged in this order of red, blue and green repeatedly. The arrangement illustrated in FIG. 9 is exemplified, where the light emitting units 410 on the first row are arranged in the order of red, blue and green, the light emitting units 410 on the second row are also arranged in the same order of red, blue and green, and the light emitting units 410 on the same column can have the same color. This means that all the light emitting units 410 on the first column are the red light emitting units 410a, all the light emitting units 410 on the second column are the green light emitting units 410b, and all the light emitting units 410 on the third column are the white light emitting units 410c. Similarly, the light emitting units 410 on the fourth column are the red light emitting units 410a, the light emitting units 410 on the fifth column are the green light emitting units 410b and the light emitting units 410 on the sixth column are the blue light emitting units 410c.

In addition, in the fourth embodiment, it is the same as other aforementioned embodiments, where the first pixel circuits are disposed on the $(2N-1)^{th}$ row and the second pixel circuits are disposed on the $(2N)^{th}$ row, and N is a positive integer. FIG. 9 is exemplified that the light emitting units 410 on the first row are connected to the first pixel circuits 420 and the light emitting units on the second row are connected to the second pixel circuits 430. Moreover, in the embodiment, the data lines are arranged in the order of DL1, DL2, DL3, DL1, DL2, DL3, and so on, where the red light emitting units 410a are connected to the data line DL1, the green light emitting units 410b are connected to the data line DL2 and the blue light emitting units 410c are connected to the data line DL3. Therefore, the signal transmission method may be the same as the first embodiment.

Figure 10:
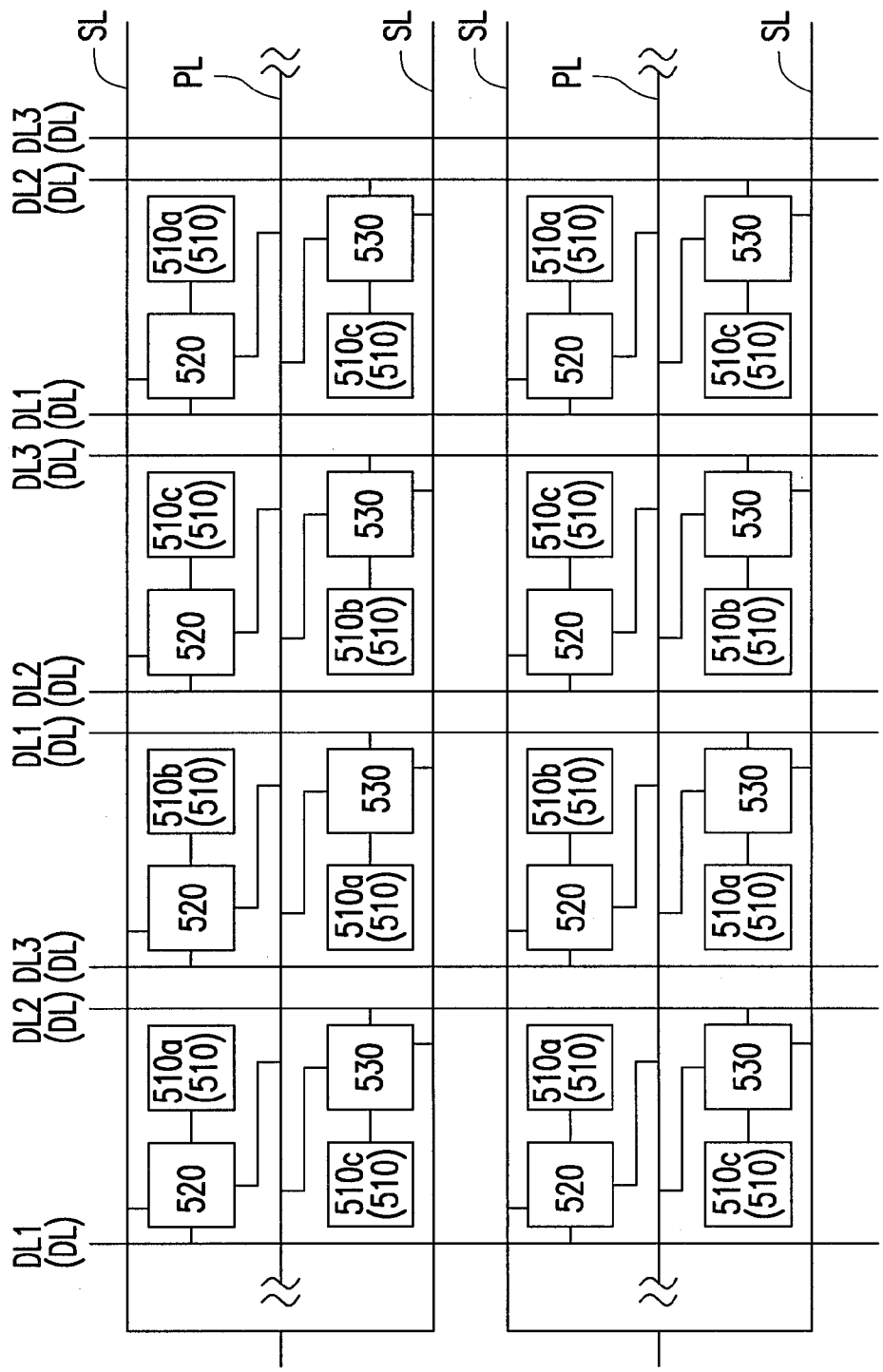
FIG. 10 is a schematic layout diagram illustrating a display panel according to a fifth embodiment of the invention.

FIG. 10 is a layout diagram illustrating a display panel according to a fifth embodiment of the invention. Under the circumstances that the light emitting units are capable of appearing in the three colors of red, green and blue, there are also other arrangements, other than the arrangement in the fourth embodiment. Referring to FIG. 10, the light emitting units 510 on the $(2N-1)^{th}$ row and the $(4M-3)^{th}$ column have the same color as the light emitting units 510 on the $(2N)^{th}$ row and the $(4M-2)^{th}$ column, while the light emitting units 510 on the $(2N-1)^{th}$ row and the $(4M-2)^{th}$ column have the same color as the light emitting units 510 on the $(2N)^{th}$ row and the $(4M-1)^{th}$ column, where M is a positive integer.

As illustrated in FIG. 10, the light emitting units 510 on the first row are arranged in the order of the red light emitting units 510a, the green light emitting units 510b and the blue light emitting units 510c. The light emitting units 510 on the second row are arranged in the order of the blue light emitting units 510c, the red light emitting units 510a, the green light emitting units 510b, the blue light emitting units 510c, the red light emitting units 510a, the green light emitting units 510b . . . and so on. Practically, the arrangement of the light emitting units 510 on the second row is only to shift the arrangement of the light emitting units 510 on the first row towards the right hand side of FIG. 9.

Referring to FIG. 1 through FIG. 3, the second terminal 123b of the first storage capacitor 123 is connected to the second terminal 121b of the first driving transistor 121 in FIG. 2, and the second terminal 133b of the second storage capacitor 133 is connected to the second terminal 131b of the second driving transistor 131 in FIG. 3. In other words, the aforementioned embodiments are exemplified by the semiconductor layer of the transistor that is an N-type semiconductor to describe herein. Certainly, the invention is not limited thereto.

FIG. 11 is another driving circuit diagram for a first pixel circuit. Referring to FIG. 11, in the driving circuit illustrated in FIG. 11, the semiconductor layer of the transistor is a P-type semiconductor, and the second terminal 623b of the first storage capacitor 623 is connected to the first terminal 621a of the first driving transistor 621. Certainly, according to such configuration, when the driving circuit of FIG. 11 is applied to the second pixel circuit of the aforementioned embodiments, the second terminal of the second storage capacitor is also connected to the first terminal of the second driving transistor (FIG. 11 only illustrates the driving circuit of the first pixel circuit, however, the driving circuit of the second pixel circuit is the same as the first pixel circuit).

FIG. 12A is a schematic top view partially illustrating a first control transistor of another embodiment. FIG. 12B is a schematic top view partially illustrating a second control transistor of the embodiment in FIG. 12A. The pattern of each control transistor is not limited to the rectangular shape illustrated by the aforementioned embodiments. Referring to FIG. 12A and FIG. 12B, the second terminals 722b, 732b of the first control transistor 722 and the second control transistor 732 may respectively have the U-shaped pattern, such that each second terminal 722b, 732b respectively wraps the corresponding first terminal 722a, 732a. Here, the definition of the first direction D4 is the main data transmission direction in the transistors 722 and 732, as illustrated in FIG. 12A and FIG. 12B.

According to the above descriptions, in the display panel of the invention, the first terminal and the second terminal (constituted by the same film) of the first control transistor are sequentially arranged on the forward direction of the first direction, and the first terminal and the second terminal (constituted by the same film) of the second control transistor are sequentially arranged on the reverse direction of the first direction. In this way, when a photomask occurs an offset on the first direction in the manufacturing process, the deviated locations of the first terminal and second terminal of the first control transistor in relative to the location of the third terminal of the first control transistor may compensate the deviated locations of the first terminal and second terminal of the second control transistor in relative to the location of the third terminal of the second control transistor. Therefore, the parasitic capacitance variations are generated in the two control transistors (that is due to the photomask offset in the manufacturing process), where the parasitic capacitance variation of one control transistor is increased and the parasitic capacitance variation of another control transistor is decreased, thereby compensating with each other to improve the display quality of the display panel.

In addition, in the display panel of the invention, the arrangement of the light emitting diodes and the corresponding scan lines and data lines have a variety of different configurations and connection methods, such that the invention has the superior design flexibility on the actual applications. Moreover, the concept of the first control transistor and the second control transistor in the invention may be applied on a variety of different driving circuit designs, therefore, the invention has more extensive applicability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display panel, comprising:
   a plurality of scan lines;
   a plurality of data lines;
   a plurality of power lines;
   a plurality of light emitting units, arranged in an array, and the light emitting units being adapted to display a variety of different colors;
   a plurality of first pixel circuits, each of the first pixel circuits comprising a first driving transistor, a first control transistor and a first storage capacitor, wherein
      the first driving transistor has a first terminal, a second terminal and a third terminal, the first terminal of the first driving transistor is connected to one of the power lines, and the second terminal of the first driving transistor is connected to one of the light emitting units;
      the first control transistor has a first terminal, a second terminal and a third terminal, the first terminal of the first control transistor is connected to one of the data lines, the second terminal of the first control transistor is connected to the third terminal of the first driving transistor, and the third terminal of the first control transistor is connected to one of the scan lines;
      a terminal of the first storage capacitor is connected to the third terminal of the first driving transistor and the second terminal of the first control transistor; and
   a plurality of second pixel circuits, each of the second pixel circuits comprising a second driving transistor, a second control transistor and a second storage capacitor, wherein
      the second driving transistor has a first terminal, a second terminal and a third terminal, the first terminal of the second driving transistor is connected to one of the power lines, and the second terminal of the second driving transistor is connected to one of the light emitting units;
      the second control transistor has a first terminal, a second terminal and a third terminal, the first terminal of the second control transistor is connected to one of the data lines, the second terminal of the second control transistor is connected to the third terminal of the second driving transistor, and the third terminal of the second control transistor is connected to one of the scan lines;
      a terminal of the second storage capacitor is connected to the third terminal of the second driving transistor and the second terminal of the second control transistor,
   wherein in the organic light emitting units with the same color, some parts are connected to the first pixel circuits and other parts are connected to the second pixel circuits,
   the first terminal and the second terminal of the first control transistor are sequentially arranged on a forward direction of a first direction, and the first terminal and the second terminal of the second control transistor are sequentially arranged on a reverse direction of the first direction, the first pixel circuits are disposed on the $(2N-1)^{th}$ row and the second pixel circuits are disposed on the $(2N)^{th}$ row, where N is a positive integer, and the scan lines connected to the first pixel circuits on the $(2N-1)^{th}$ row and the second pixel circuits on the $(2N)^{th}$ row have the same scan signal.

2. The display panel as claimed in claim 1, wherein the first terminals and the second terminals of the first control transistors and the first terminals and the second terminals of the second control transistors are constituted of the same film.

3. The display panel as claimed in claim 1, wherein the first pixel circuits on the $(2N-1)^{th}$ row and the second pixel circuits on the $(2N)^{th}$ row are connected to the same scan line.

4. The display panel as claimed in claim 1, wherein the light emitting units on each row comprise the light emitting units with at least three different colors.

5. The display panel as claimed in claim 4, wherein two adjacent light emitting units on the same column display different colors.

6. The display panel as claimed in claim 1, wherein the light emitting units on the $(2N-1)^{th}$ row and the $(4M-3)^{th}$ column and the light emitting units on the $(2N)^{th}$ row and the $(4M-1)^{th}$ column have the same color, and the light emitting units on the $(2N-1)^{th}$ row and the $(4M-2)^{th}$ column and the light emitting units on the $(2N)^{th}$ row and the $(4M)^{th}$ column have the same color, where M is a positive integer.

7. The display panel as claimed in claim 6, wherein the light emitting units on the $(2N-1)^{th}$ row and the $(4M-3)^{th}$, $(4M-2)^{th}$ columns and the light emitting units on the $(2N)^{th}$ row and the $(4M-1)^{th}$, $(4M)^{th}$ columns are connected to odd data lines, and the light emitting units on the $(2N-1)^{th}$ row and $(4M-1)^{th}$, $(4M)^{th}$ columns and the light emitting units on the $(2N)^{th}$ row and $(4M-3)^{th}$, $(4M-2)^{th}$ columns are connected to even data lines.

8. The display panel as claimed in claim 6, wherein the light emitting units on the $(2N-1)^{th}$ row are connected to the odd data lines, while the light emitting units on the $(2N)^{th}$ row are connected to the even data lines.

9. The display panel as claimed in claim 1, wherein the light emitting units on the $(2N-1)^{th}$ row and the $(4M-3)^{th}$ column and the light emitting units on the $(2N)^{th}$ row and the $(4M-2)^{th}$ column have the same color, and the light emitting units on the $(2N-1)^{th}$ row and the $(4M-2)^{th}$ column and the light emitting units on the $(2N)^{th}$ row and the $(4M-1)^{th}$ column have the same color, where N and M are respectively a positive integer.

10. The display panel as claimed in claim 9, wherein the light emitting units on the $(2N-1)^{th}$ row are connected to the odd data lines, while the light emitting units on the $(2N)^{th}$ row are connected to the even data lines.

11. The display panel as claimed in claim 1, wherein two adjacent light emitting units on the same row display different colors.

12. The display panel as claimed in claim 1, wherein the second terminals of the first control transistors are deviated towards the forward direction of the first direction in relative to the third terminals, and the second terminals of the second control transistors are deviated towards the forward direction of the first direction in relative to the third terminals.

13. The display panel as claimed in claim 1, wherein another terminal of the first storage capacitor is connected to the first terminal of the first driving transistor, and another terminal of the second storage capacitor is connected to the first terminal of the second driving transistor.

14. The display panel as claimed in claim 1, wherein another terminal of the first storage capacitor is connected to the second terminal of the first driving transistor, and another terminal of the second storage capacitor is connected to the second terminal of the second driving transistor.

15. The display panel as claimed in claim 1, wherein the light emitting units each comprises an organic light emitting unit.

* * * * *